United States Patent
Barton et al.

(10) Patent No.: US 12,064,846 B2
(45) Date of Patent: *Aug. 20, 2024

(54) FORMULATIONS FOR HIGH POROSITY CHEMICAL MECHANICAL POLISHING PADS WITH HIGH HARDNESS AND CMP PADS MADE THEREWITH

(71) Applicant: Rohm and Haas Electronic Materials CMP Holdings, Inc., Newark, DE (US)

(72) Inventors: Bryan E. Barton, Lincoln University, PA (US); Annette M. Crevasse, Elkton, MD (US); Teresa Brugarolas Brufau, Philadelphia, PA (US); Vere O. Archibald, North Wales, PA (US); Michael E. Mills, Bear, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 615 days.

This patent is subject to a terminal disclaimer.

(21) Appl. No.: 17/154,807

(22) Filed: Jan. 21, 2021

(65) Prior Publication Data
US 2022/0226961 A1 Jul. 21, 2022

(51) Int. Cl.
| | | |
|---|---|---|
| B24B 37/24 | (2012.01) | |
| B24B 37/22 | (2012.01) | |
| C08G 18/10 | (2006.01) | |
| C08G 18/12 | (2006.01) | |
| C08G 18/18 | (2006.01) | |
| C08G 18/24 | (2006.01) | |
| C08G 18/32 | (2006.01) | |
| C08G 18/48 | (2006.01) | |
| C08G 18/66 | (2006.01) | |
| C08G 18/76 | (2006.01) | |
| C09D 175/04 | (2006.01) | |
| C09D 175/08 | (2006.01) | |
| H01L 21/306 | (2006.01) | |

(52) U.S. Cl.
CPC ............ *B24B 37/24* (2013.01); *B24B 37/22* (2013.01); *C08G 18/10* (2013.01); *C08G 18/12* (2013.01); *C08G 18/1808* (2013.01); *C08G 18/246* (2013.01); *C08G 18/3203* (2013.01); *C08G 18/3206* (2013.01); *C08G 18/3225* (2013.01); *C08G 18/4825* (2013.01); *C08G 18/4854* (2013.01); *C08G 18/6607* (2013.01); *C08G 18/6674* (2013.01); *C08G 18/76* (2013.01); *C08G 18/7671* (2013.01); *C09D 175/04* (2013.01); *C09D 175/08* (2013.01); *C08G 2110/00* (2021.01); *H01L 21/30625* (2013.01)

(58) Field of Classification Search
CPC ......... B24B 37/24; B24B 37/22; C08G 18/12; C08G 18/1808; C08G 18/3206; C08G 18/4854; C08G 18/6674; C08G 18/7671; C08G 2110/00; C08G 18/246; C08G 18/6607; C08G 18/10; C08G 18/3203; C08G 18/3225; C08G 18/4825; C08G 18/76; H01L 21/30625; C09D 175/04; C09D 175/08
See application file for complete search history.

(56) References Cited

U.S. PATENT DOCUMENTS

| | | | |
|---|---|---|---|
| 2014/0038503 A1 | 2/2014 | Kouki et al. | |
| 2018/0148537 A1* | 5/2018 | Barton | C08G 18/12 |
| 2018/0169827 A1* | 6/2018 | Smith | B24B 37/24 |
| 2020/0391344 A1* | 12/2020 | Joeng | C08G 18/758 |
| 2021/0008687 A1 | 1/2021 | Ma et al. | |

FOREIGN PATENT DOCUMENTS

JP 5939963 6/2014

OTHER PUBLICATIONS

Search report for corresponding Chinese Application No. 202210058958.0 dated Oct. 25, 2023.

* cited by examiner

*Primary Examiner* — Rabon A Sergent
(74) *Attorney, Agent, or Firm* — Blake T. Biederman; Simon L. Xu

(57) ABSTRACT

The present invention provides CMP polishing pads or layers having a Shore DO (15 second) hardness of from 40 to 80 made from a two-component reaction mixture of (i) a liquid aromatic isocyanate component comprising one or more aromatic diisocyanates or a linear aromatic isocyanate-terminated urethane prepolymer, and (ii) a liquid polyol component comprising a) one or more polymeric polyols, b) from 15 to 36 wt. %, based on the total weight of the liquid polyol component, of one or more small chain difunctional polyols having from 2 to 6 carbon atoms, c) from 0 to 25 wt. %, based on the total weight of the liquid polyol component, of a liquid aromatic diamine which is a liquid at standard pressure and at 40° C., and d) an amount of water or $CO_2$-amine adduct sufficient to reduce the density of a CMP polishing pad made from the two-component reaction mixture to from 0.2 to 0.50 g/mL, wherein the reaction mixture comprises 60 to 75 wt. % of hard segment materials, based on the total weight of the reaction mixture.

10 Claims, No Drawings

FORMULATIONS FOR HIGH POROSITY CHEMICAL MECHANICAL POLISHING PADS WITH HIGH HARDNESS AND CMP PADS MADE THEREWITH

The present invention relates to two-component polyurethane compositions for making chemical mechanical planarization polishing (CMP polishing) pads having a Shore DO hardness (15 seconds) of 40 or more and a specific gravity (SG) of 0.5 or less, the CMP polishing pads made from them and methods for making the same. More particularly, the present invention relates to CMP polishing pads comprising the polyurethane foam reaction product of a two-component reaction mixture of a liquid aromatic diisocyanate component and a liquid polyol component comprising a short chain diol and a liquid aromatic diamine curative, wherein the liquid polyol component contains, e.g. water in the amount of from 1000 to 8500 ppm, based on the total weight of the two-component reaction mixture.

In a CMP process, a polishing pad in combination with a polishing solution, such as an abrasive-containing polishing slurry and/or an abrasive-free reactive liquid, removes excess material in a manner that planarizes or maintains flatness of a semiconductor, optical or magnetic substrate. There is an ongoing need for CMP polishing pads that have increased layer uniformity or planarization performance in combination with acceptable removal rate. However, there has remained in the industry a performance tradeoff between removal rate or hardness and defectivity with greater removal rate or hardness resulting in more defects.

U.S. patent publication no. US2014/0038503A1, to Itoyama et al. discloses methods of making molded CMP polishing pads of polyurethane-urea foams having a density of from 0.30 to 0.60 g/cm$^3$ and a type D hardness (JIS K 6253-1997/ISO 7619) of from 5 to 35 degrees. The formulations for the CMP polishing pads comprise a mixture of an isocyanate compound, a polyisocyanate compound, a polyamine compound and an aqueous dispersion mixture comprising water, a foam stabilizer, a reaction catalyst and a non-reactive gas. The compositions further comprise a polyol which is disclosed as having a number average molecular weight of from 500 to 5000. The Itoyama pads include pores generated by reaction of water and isocyanate; however, the disclosed pads are soft because if the hardness is too high, scratches or defects would be formed on the polished substrates. See [0076].

The present inventors have sought to solve the problem of providing a more flexible formulation window for making chemical mechanical polishing layers or pads that have improved hardness and removal rate performance without an undesirable increase in defectivity.

STATEMENT OF THE INVENTION

1. In accordance with the present invention, organic solvent free reaction mixtures for forming a chemical mechanical polishing (CMP polishing) layer comprise (i) a liquid aromatic isocyanate component comprising one or more aromatic diisocyanates or a linear aromatic isocyanate-terminated urethane prepolymer having an unreacted isocyanate (NCO) concentration of from 18 to 40 wt. %, or, preferably, from 18 to 34 wt. %, based on the total solids weight of the liquid aromatic isocyanate component, preferably a linear methylene diphenyl diisocyanate (MDI) prepolymer, and (ii) a liquid polyol component comprising a) one or more polymeric polyols, such as polytetramethylene glycol (PTMEG), polypropylene glycol (PPG), a hexafunctional polyol, or mixtures thereof, b) from 15 to 36 wt. %, based on the total weight of the liquid polyol component, of one or more small chain difunctional polyols having from 2 to 6 carbon atoms, such as, for example, ethylene glycol, 1,2-propylene glycol, 1,3-propylene glycol, 1,2-butanediol, 1,3-butanediol, 2-methyl-1,3-propanediol, 1,4-butanediol, neopentyl glycol, 1,5-pentanediol, 3-methyl-1,5-pentanediol, 1,6-hexanediol, diethylene glycol, dipropylene glycol, tripropylene glycol, and mixtures thereof, or, preferably, ethylene glycol, propylene glycol, diethylene glycol, dipropylene glycol and/or triethylene glycol, as well as c) from 0 to 25 wt. %, based on the total weight of the liquid polyol component, of a liquid aromatic diamine which is a liquid at standard pressure and at 40° C., and d) an amount of water or $CO_2$-amine adduct, such as $CO_2$-alkanolamine, sufficient to reduce the density of a CMP polishing pad made from the two-component reaction mixture to from 0.2 to 0.50 g/mL or, preferably, from 0.35 to 0.495 g/mL, such as from 1000 and 8500 ppm, or, preferably, from 1000 to 5,000 ppm of water or from 0.25 to 4 wt. %, or, preferably, from 0.4 to 2.5 wt. % of a $CO_2$-amine adduct, the amounts based on the total weight of the two-component reaction mixture, wherein the reaction mixture comprises 60 to 75 wt. % or, preferably, from greater than 63 to 75 wt. % of hard segment materials, based on the total weight of the reaction mixture. The two-component reaction mixtures are free of microelements other than those formed by the water or $CO_2$-amine adduct.

2. In accordance with the present invention, organic solvent free reaction mixtures for forming a chemical mechanical polishing (CMP polishing) layer as in item 1, above, wherein the reaction mixtures have a gel time at 65° C. of from 15 seconds to 3 minutes or, preferably, from 15 seconds to 2 minutes.

3. In accordance with a separate aspect of the present invention, chemical mechanical (CMP) polishing pads for polishing a substrate chosen from at least one of a magnetic substrate, an optical substrate and a semiconductor substrate, the polishing pads comprise a polishing layer adapted for polishing the substrate, the polishing layer comprises a polyurethane reaction product of an organic solvent free two-component reaction mixture comprising (i) a liquid aromatic isocyanate component comprising one or more aromatic diisocyanates or a linear aromatic isocyanate-terminated urethane prepolymer having an unreacted isocyanate (NCO) concentration of from 18 to 40 wt. %, or, preferably, from 18 to 34 wt. %, based on the total solids weight of the aromatic isocyanate component, preferably a linear methylene diphenyl diisocyanate (MDI) prepolymer and (ii) liquid polyol component comprising a) one or more polymeric polyols, such as polytetramethylene glycol (PTMEG), polypropylene glycol (PPG), a hexafunctional polyol, or mixtures thereof, b) from 15 to 36 wt. %, based on the total weight of the liquid polyol component, of one or more small chain difunctional polyols having from 2 to 6 carbon atoms, such as, for example, ethylene glycol, 1,2-propylene glycol, 1,3-propylene glycol, 1,2-butanediol, 1,3-butanediol, 2-methyl-1,3-propanediol, 1,4-butanediol, neopentyl glycol, 1,5-pentanediol, 3-methyl-5-pentanediol, 1,6-hexanediol, diethylene glycol, dipropylene glycol, tripropylene glycol and mixtures thereof, or, preferably, ethylene glycol, propylene glycol, diethylene glycol, dipropylene glycol and/or triethylene glycol, as well as c) from 0 to 25 wt. %, based on the total weight of the liquid polyol component, of a liquid aromatic diamine which is a liquid under ambient conditions, for example, any chosen from dimethylthio-toluene diamines, toluene diamines, tert-butyl toluene diamines, such as 5-tert-butyl-2,4- or 3-tert-butyl- 2,6-toluenediamine, chlorotoluenediamines, and N,N'-dialkylaminodiphenylmethane, and mixtures thereof, or, preferably, chlorotoluenediamines, dimethylthio-toluene diamines, and mixtures thereof; diethyltoluenediamine (DETDA) and N,N'-dialkylaminodiphenylmethane, and d) an amount of water or $CO_2$-amine adduct, such as $CO_2$-alkanolamine, sufficient to reduce the density of the CMP polishing pad to from 0.2 to 0.50 g/mL or, preferably, from 0.35 to 0.495 g/mL, such as from 1000 and 8500 ppm, or, preferably, from 1000 and 5000 ppm of water or, from 0.25 to 4.0 wt. %, or, preferably, from 0.4 to 2.5 wt. % of a $CO_2$-amine adduct, such as $CO_2$-alkanolamine, the amounts based on the total weight of the two-component reaction mixture, wherein the reaction mixture comprises 60 to 75 wt. % or, preferably, from greater than 63 to 75 wt. % of hard segment materials, based on the total weight of the reaction mixture, wherein the CMP polishing layer has a Shore DO (15 second) hardness of from 40 to 80, or, preferably, at least 43 or from 43 to 80, and with densities of from 0.2 to 0.55 g/mL or, preferably, from 0.35 to 0.50 g/mL, or, even more preferably, from 0.35 to 0.495 g/mL; preferably, further wherein the CMP polishing layer is free of microelements other than those formed by the water or $CO_2$-amine adduct.

4. In accordance with the CMP polishing pad or the reaction mixture of the present invention as in any one of items 1, 2, or 3, above, wherein the stoichiometric ratio of the sum of the total moles of amine ($NH_2$) groups and the total moles of hydroxyl (OH) groups in the reaction mixture to the total moles of unreacted isocyanate (NCO) groups in the reaction mixture to make the CMP polishing layer ranges from 0.85:1.0 to 1.15:1.0, or, preferably, from 0.9:1.0 to 1.1:1.0.

5. In accordance with the CMP polishing pad of the present invention as in any one of items 3 or 4, above, wherein the (i) liquid aromatic isocyanate component comprises one or more diisocyanate or isocyanate-terminated linear urethane prepolymer compound chosen from methylene diphenyl diisocyanate (MDI); toluene diisocyanate (TDI); napthalene diisocyanate (NDI); paraphenylene diisocyanate (PPDI); or o-toluidine diisocyanate (TODI); mixtures thereof; a linear isocyanate-terminated urethane prepolymer having a hard segment material content of from 84 to 100 wt. % or, preferably, from 90 to 100 wt. % of any of MDI, TDI, NDI, PPDA, TODI or mixtures thereof extended with one or more extender compound any of ethylene glycol, 1,2-propylene glycol, 1,3-propylene glycol, 1,2-butanediol, 1,3-butanediol, 2-methyl-1,3-propanediol, 1,4-butanediol, neopentyl glycol, 1,5-pentanediol, 3-methyl-1,5-pentanediol, 1,6-hexanediol, diethylene glycol, dipropylene glycol, tripropylene glycol and mixtures thereof, preferably, a linear isocyanate-terminated urethane prepolymer of MDI which is MDI or an MDI dimer extended with one or more extender compound.

6. In accordance with the CMP polishing pad of the present invention as in any one of items 3, 4, or 5, above, wherein the liquid aromatic diamine curative is a liquid at ambient conditions chosen from dimethylthio-toluene diamines, a mixture of the isomers 2,4-diamino-3,5-dimethylthiotoluene and 3,5-dimethylthio-2,4-toluenediamine; diethyl toluene diamines; tert-butyl toluene diamines, such as 5-tert-butyl-2,4- or 3-tert-butyl-2,6-toluenediamine; chlorotoluenediamines; and N,N'-dialkylaminodiphenylmethane and mixtures thereof, or, preferably, chlorotoluenediamines or dimethylthio-toluene diamines, a mixture of the isomers 2,4-diamino-3,5-dimethylthiotoluene and 3,5-dimethylthio-2,4-toluenediamine diethyltoluenediamine (DETDA) and N,N'-dialkylaminodiphenylmethane.

7. In accordance with the chemical mechanical polishing pad of present invention as in any one of items 1, 2, 3, 4, 5, or 6, above, the polishing pad comprising the CMP polishing layer and further comprising a sub pad or backing layer such as a polymer impregnated non-woven, or polymer sheet, onto bottom side of a polishing layer so that the polishing layer forms the top of the polishing pad.

8. In yet another aspect, the present invention provides methods for making chemical mechanical (CMP) polishing pads having a polishing layer adapted for polishing a substrate comprising providing the two component reaction mixture as in any one of items 1, 2, 3, 4, 5 or 6, above, mixing the (i) liquid aromatic isocyanate component and the (ii) liquid polyol component, such as, for example, in a static mixer or an impingement mixer, and applying the reaction mixture as one component to an open mold surface, preferably, having a male topography that forms a female groove pattern in the top surface of a CMP polishing pad, curing the reaction mixture at from ambient temperature to 130° C. to form a molded polyurethane reaction product, for example, initially curing at from ambient temperature to 130° C. for a period of from 1 to 30 minutes, or, preferably, from 30 seconds to 5 minutes, removing the polyurethane reaction product from the mold, and then finally curing at a temperature from 60 to 130° C. for a period of 1 minutes to 16 hours, or preferably from 5 min to 15 minutes.

9. In accordance with the methods of the present invention as in item 8, above, wherein the forming of the polishing pad further comprises stacking a sub pad layer, such as a polymer impregnated non-woven, or porous or non-porous polymer sheet, onto bottom side of a polishing layer so that the polishing layer forms the top surface of the polishing pad.

10. In accordance with the methods of the present invention as in any one of items 8 or 9, above, wherein the methods form the surface of the CMP polishing pad directly in the mold.

11. In accordance with the methods of the present invention as in any one of items 8, 9, or 10, above, wherein the applying the reaction mixture as one component comprises overspraying the mold, followed by the curing to form a polyurethane reaction product, removing the polyurethane reaction product from the mold and then punching or cutting the perimeter of the polyurethane reaction product to the desired diameter of the CMP polishing pad.

12. In yet still another aspect, the present invention provides methods of polishing a substrate, comprising: Providing a substrate selected from at least one of a magnetic substrate, an optical substrate and a semiconductor substrate; providing a chemical mechanical (CMP) polishing pad according to any one of items 1 to 7 above; creating dynamic contact between a polishing surface of the polishing layer of the CMP polishing pad and the substrate to polish a surface of the substrate; and, conditioning of the polishing surface of the polishing pad with an abrasive conditioner.

Unless otherwise indicated, conditions of temperature and pressure are ambient temperature and standard pressure. All ranges recited are inclusive and combinable.

Unless otherwise indicated, any term containing parentheses refers, alternatively, to the whole term as if no parentheses were present and the term without them, and combinations of each alternative. Thus, the term "(poly) isocyanate" refers to isocyanate, polyisocyanate, or mixtures thereof.

All ranges are inclusive and combinable. For example, the term "a range of 50 to 3000 cPs, or 100 or more cPs" would include each of 50 to 100 cPs, 50 to 3000 cPs and 100 to 3000 cPs.

For purposes of this the present invention, the reaction mixtures are expressed in wt. %, unless specifically noted otherwise.

As used herein, the term "ASTM" refers to publications of ASTM International, West Conshohocken, PA.

As used herein, the term "average number of isocyanate groups" means the weighted average of the number of isocyanate groups in a mixture of aromatic isocyanate compounds. For example, a 50:50 wt. % mix of MDI (2 NCO groups) and an isocyanurate of MDI (considered as having 3 NCO groups) has an average of 2.5 isocyanate groups.

As used herein, the term "gel time" means the result obtained by mixing a given reaction mixture at about 65° C., for example, in an VM-2500 vortex lab mixer (StateMix Ltd., Winnipeg, Canada) set at 1000 rpm for 30 s, setting a timer to zero and switching the timer on, pouring the mixture into an aluminum cup, placing the cup into a hot pot of a gel timer (Gardco Hot Pot™ gel timer, Paul N. Gardner Company, Inc., Pompano Beach, FL) set at 65° C., stirring the reaction mixture with a wire stirrer at 20 RPM and recording the gel time when the wire stirrer stops moving in the sample.

As used herein, the term "hard segment" of a polyurethane reaction product or a raw material from either of the liquid polyol component and liquid aromatic isocyanate component refers to that portion of the indicated reaction mixture which comprises any diol, glycol, diglycol, triglycol having 6 carbon atoms or less, any diamine, triamine or polyamine, diisocyanate, triisocyanate, or reaction product thereof. The "hard segment" thus excludes polyethers or polyglycols, such as polyethylene glycols or polypropylene glycols, or polyoxyethylenes having three or more ether groups.

As used herein, the term "microelements other than those formed by the water or $CO_2$-amine adduct" means microelements chosen from hollow core polymeric materials, such as polymeric microspheres, liquid filled hollow core polymeric materials, such as fluid-filled polymeric microspheres, and fillers, such as boron nitride. Pores formed in the CMP polishing layer by gas or blowing agents that solely form gases, such as $CO_2$-amine adducts, are not considered microelements.

As used herein, the term "polyisocyanate" means any isocyanate group containing molecule containing two or more isocyanate groups.

As used herein, the term "polyisocyanate prepolymer" means any isocyanate group containing molecule that is the reaction product of an excess of a diisocyanate or polyisocyanate with an active hydrogen containing compound containing two or more active hydrogen groups, such as diamines, diols, triols, and polyols.

As used herein, the term "polyurethanes" refers to polymerization products from difunctional or polyfunctional isocyanates, e.g. polyetherureas, polyisocyanurates, polyurethanes, polyureas, polyurethaneureas, copolymers thereof and mixtures thereof.

As used herein, the term "reaction mixture" includes any non-reactive additives, such as microelements and any additives to lower the hardness of a polyurethane reaction product in the CMP polishing pad according to ASTM D2240-15 (2015).

As used herein, the term "stoichiometry" of a reaction mixture refers to the ratio of molar equivalents of (free OH+free $NH_2$ groups) to free NCO groups in the reaction mixture.

As used herein, the term "SG" or "specific gravity" refers to the weight/volume ratio of a rectangular cut out of a polishing pad or layer in accordance with the present invention.

As used herein, the term "Shore DO hardness" is the 15 second hardness of a given CMP polishing as measured according to ASTM D2240-15 (2015), "Standard Test Method for Rubber Property-Durometer Hardness". Hardness was measured on a Rex Hybrid hardness tester (Rex Gauge Company, Inc., Buffalo Grove, IL), equipped with an O probe. Six samples were stacked and shuffled for each hardness measurement; and each pad tested was conditioned by placing it in 50 percent relative humidity for five days at 23° C. before testing and using methodology outlined in ASTM D2240-15 (2015) to improve the repeatability of the hardness tests. In the present invention, the Shore D hardness of the polyurethane reaction product of the polishing layer or pad includes the Shore D hardness of that reaction including any additive to increase hardness. The term "Shore A" hardness refers to the same 15 second hardness measure with a larger A probe for softer materials.

As used herein, the term "solids" refers to any materials that remain in the polyurethane reaction product of the present invention; thus, solids include reactive and nonvolatile liquids and additives that do not volatilize upon cure. Solids exclude water and volatile solvents.

As used herein, unless otherwise indicated, the term "viscosity" refers to the viscosity of a given material in neat form (100%) at a given temperature as measured using a rheometer, set at an oscillatory shear rate sweep from 0.1-100 rad/sec in a 50 mm parallel plate geometry with a 100 μm gap.

As used herein, unless otherwise indicated, the term "wt. % NCO" refers to the amount of unreacted or free isocyanate groups a given isocyanate or isocyanate-terminated urethane prepolymer composition.

As used herein, the term "wt. %" stands for weight percent.

In accordance with the present invention, the present inventors have discovered that CMP polishing pads having a high porosity CMP polishing layer with a Shore DO (15 second) hardness>40 are useful hard-pads with attractive removal rate profiles and that enable polishing with low defectivity. In particular, a CMP polishing layer formed by the spraying of a reaction mixture having a hard segment weight fraction that is from 60 wt. % to 68 wt. % or, preferably, higher than 60 wt. % provides hard having Shore DO (15 second) values above 40 or, preferably, at least 43, and with densities below 0.50 g/mL. CMP polishing pads in this range of hardness and porosity were previously unattainable from other CMP production methods. Further, the defectivity resulting from the use of the CMP polishing pads of the present invention has been surprisingly good. While improved tensile modulus in a CMP polishing pad is recognized as a key driver for improved planarization efficiency (PE), the same tensile modulus increases defects formed in CMP polishing.

The CMP polishing pads of the present invention are formed from two-component reaction mixtures having a liquid aromatic diisocyanate component and a liquid polyol component which further contains a liquid aromatic diisocyanate component. The liquid aromatic diisocyanate component comprises one or more liquid aromatic diisocyanate or a linear aromatic isocyanate-terminated urethane prepolymer. A suitable linear urethane prepolymer may be a methylene diphenyl isocyanate (MDI) diisocyanate prepolymer having an NCO content above 18 wt. %; an example of such a linear aromatic isocyanate-terminated urethane prepolymer includes the prepolymer formed from MDI and (di) ethylene glycol having an NCO content of 23.0 wt. % and an equivalent weight of 182 g/mol. Suitable reaction mixtures further comprise from 0 to 25 wt. %, based on the total weight of the reaction mixture of a liquid aromatic diamine as a curative. The liquid aromatic diamine curative helps to impart fast reaction times and good mechanical properties of high tensile strength and high tensile modulus.

The hard segment of the reaction mixture insures good mechanical properties. The hard segment can be 60 to 68 wt. % of the reaction mixture and can comprise part of both the polyol component and the aromatic isocyanate component.

As part of the hard segment of the reaction mixture, a diisocyanate is preferably methylene diphenyl diisocyanate (MDI), which is less toxic compared to toluene diisocyanate (TDI). The liquid aromatic isocyanate component can comprise a linear isocyanate-terminated urethane prepolymer formed from extenders or short chain diols like glycols and diglycols or, preferably, monoethylene glycol (MEG), dipropylene glycol (DPG), and/or tripropylene glycol (TPG).

Preferably, liquid aromatic diisocyanate component contains only impurity levels of aliphatic isocyanate.

The soft segment of the reaction mixture can comprise polymeric polyols, such as difunctional polyethers in the (ii) polyol component. Suitable soft polyols are PTMEG and PPG. Available examples of PTMEG containing polyols are as follows: Terathane™ 2900, 2000, 1800, 1400, 1000, 650 and 250 from Invista, Wichita, KS; Polymeg™ 2900, 2000, 1000, 650 from Lyondell Chemicals, Limerick, PA; Poly-THF™ 650, 1000, 2000 from BASF Corporation, Florham Park, NJ Available examples of PPG containing polyols are as follows: Arcol™ PPG-425, 725, 1000, 1025, 2000, 2025, 3025 and 4000 from Covestro, Pittsburgh, PA; Voranol™, Voralux™, and Specflex™ product lines from Dow, Midland, MI; Multranol™, Ultracel™, Desmophen™ or Acclaim™ polyol 12200, 8200, 6300, 4200, 2200, each from Covestro (Leverkusen, DE).

The soft segment of the reaction mixture may also comprise one or more polyols having a polyether backbone and having from 5 to 7 hydroxyl groups per molecule.

Suitable polyols having a polyether backbone and having from 5 to 7 hydroxyl groups per molecule are available as a VORANOL™ 202 Polyol (Dow) having 5 hydroxyl groups, a number average molecular weight of 590 and a hydroxyl number of 475 mg KOH/g, a MULTRANOL™ 9185 polyol (Dow) having 6 hydroxyl groups, a number average molecular weight of 3,366 and a hydroxyl number of 100 mg KOH/g, or a VORANOL™ 4053 polyol (Dow) having an average of 6.9 hydroxyl groups, a number average molecular weight of 12,420 and a hydroxyl number of 31 mg KOH/g.

The amount of the ii) a) polymeric polyol in the liquid polyol component can range in amount of up to 85 wt. % of the liquid polyol component.

The liquid aromatic diamine curative of the present invention may comprise from 0 to 25 wt. %, or, preferably, from 0 to 20 wt. %, based on the total solids weight of the reaction mixture.

Suitable curatives are aromatic diamines which are liquids at standard pressure and at 40° C. However, the curatives must be slow enough to allow the mixing of two component reaction mixture. The curatives must, when combined with the aromatic isocyanate component and the polyol component, cause gelling (so the reactive mixture combination no longer flows) of at least 15 seconds, or, preferably, at least 20 seconds. Accordingly, the curatives of the present invention do not comprise more than 5 wt. %, as solids, of N,N-primary alkylaryl diamines, or N,N-secondary or tertiary alkyl diamines.

To increase the reactivity of the polyol component with the diisocyanate or polyisocyanate, a catalyst may be used. Suitable catalysts include any known catalysts to those skilled in the art, for example, oleic acid, azelaic acid, dibutyltindilaurate, tin octoate, bismuth octoate, 1,8-diazabicyclo[5.4.0]undec-7-ene (DBU), tertiary amine catalysts, such as Dabco™ TMR catalyst, triethylenediamine, such as DABCO™ 33 LV, and mixtures of the above. The amine catalysts may accelerate the blowing reaction.

The reaction mixture of the present invention is substantially free of added organic solvents.

The specific gravity of the resulting CMP polishing pad ranges from 0.2 to 0.5, preferably, from 0.35 to 0.495. As porosity increases, the bulk properties of the CMP polishing pad diminish, and removal rate (RR) goes up. However, defectivity and planarization efficiency would not be expected to improve where the CMP polishing pad or layer exhibits increased porosity and is a hard layer or pad.

The CMP polishing pad or layer of the present invention comprises a porous material having large number average pore sizes ($X_{50}$), as determined by scanning electron microscopy (SEM) ranging from 75 to 200 microns, or, preferably, from 80 to 140 microns. The stoichiometry of the reaction mixture of the present invention ranges from (NH+OH): NCO 0.85:1.0 to 1.15:1.0.

The chemical mechanical polishing layers or pads of the present invention comprise a polishing layer which is a homogenous dispersion of a porous polyurethane. Homogeneity is important in achieving consistent polishing pad performance. Accordingly, the reaction mixture of the present invention is chosen so that the resulting pad morphology is stable and easily reproducible. For example, it is often important to control additives such as anti-oxidizing agents, and impurities such as water for consistent manufacturing.

In accordance with the present invention, the CMP polishing layers can be made by methods of spraying a reaction mixture onto an open mold and allowing it to cure. Because the two-component reaction mixtures of the present invention can be sprayed or deposited as a fluid to make the CMP polishing layers, the reaction mixtures of the present invention can react much faster than in the case where such layers are formed in a closed mold. Suitable reaction mixture gel times range from 10 seconds or more or, preferably, 15 seconds to 2 minutes at 65° C.

The liquid reaction mixtures of the present invention can comprise a very rapid curing composition wherein the (i) liquid aromatic isocyanate component and the (ii) liquid polyol component can gel in a gel time as short as 15 seconds. The reaction has to be slow enough that the reaction mixture can be mixed in a static or impingement mixer after combining the two components. One limit on gel time is that the reaction mixture must react slowly enough so as not to clog the mix head in which it is mixed, and to adequately fill a mold when applying it to the mold surface.

Preferably, the target or substrate in the methods of the present invention is an open mold wherein the produced pad will have groove pattern directly incorporated.

The CMP polishing layers of the present invention can be produced via impingement mixing or static mixing of the reaction mixture in combination with a blowing agent such as water or a $CO_2$ amine (carbamate), e.g. $CO_2$-alkanolamine blowing reagent. After impingement or static mixing, the reactive mixture is atomized out of a spray nozzle toward a target in air induced or airless spraying. In this manner, polyurethane or polyurethane-urea CMP polishing layers with variable porosities ranging from 0.1 g/mL to 0.5 g/mL can be obtained in a controlled process with good uniformity of roughly spherical pores throughout the pad.

The quick gel time of the reaction mixtures of the present invention means that pores formed in spraying or deposition will remain in the cured CMP polishing layer. Thus, surfactants, such as a nonionic surfactant, such as a polyethoxylated siloxane, is not needed in the reaction mixtures of the present invention to produce stable foam articles therefrom.

In addition, because the CMP polishing pads of the present invention are formed by spraying or frothing to make bubbles in the presence of a blowing agent, microelements, such as hollow microspheres, are not needed and are, preferably, absent.

Porosity is introduced into the pad or polishing layer by spraying and the resulting tensile modulus of the pad is a function of both the intrinsic polymer tensile modulus and the porosity, and increasing porosity acts to reduce the density of specific gravity. Thus, for a two-component spray manufactured pad or polishing layer to deliver acceptable tensile modulus, the polymer matrix tensile modulus has to be acceptably high, preferably greater than 344 MPa, and more preferably greater than 482 MPa.

Polishing layer or pad density is as measured according to ASTM D1622-08 (2008). Density is the same as specific gravity.

The CMP polishing layers or pads of the invention are efficacious for interlayer dielectric (ILD) and inorganic oxide polishing. For purposes of the present invention, the removal rate refers to the removal rate as expressed in A/min.

The chemical mechanical polishing pads of the present invention can comprise just a polishing layer of the polyurethane reaction product or the polishing layer stacked on a subpad or sub layer. The polishing pad or, in the case of stacked pads, the polishing layer of the polishing pad of the present invention is useful in both porous and non-porous or unfilled configurations.

Preferably, the polishing layer used in the chemical mechanical polishing pad of the present invention has an average thickness of from 500 to 3750 microns (20 to 150 mils), or, more preferably, from 750 to 3150 microns (30 to 125 mils), or, still more preferably, from 1000 to 3000 microns (40 to 120 mils), or, most preferably, from 1250 to 2500 microns (50 to 100 mils).

The chemical mechanical polishing pad of the present invention optionally further comprises at least one additional layer interfaced with the polishing layer. Preferably, the chemical mechanical polishing pad optionally further comprises a compressible sub pad or base layer adhered to the polishing layer. The compressible base layer preferably improves conformance of the polishing layer to the surface of the substrate being polished.

The polishing layer of the chemical mechanical polishing pad of the present invention has a polishing surface adapted for polishing the substrate. Preferably, the polishing surface has macrotexture selected from at least one of perforations and grooves. Perforations can extend from the polishing surface part way or all the way through the thickness of the polishing layer.

Preferably, grooves are arranged on the polishing surface such that upon rotation of the chemical mechanical polishing pad during polishing, at least one groove sweeps over the surface of the substrate being polished.

Preferably, the polishing layer of the chemical mechanical polishing pad of the present invention has a polishing surface adapted for polishing the substrate, wherein the polishing surface has a macrotexture comprising a groove pattern formed therein and chosen from curved grooves, linear grooves, perforations and combinations thereof. Preferably, the groove pattern comprises a plurality of grooves. More preferably, the groove pattern is selected from a groove design, such as one selected from the group consisting of concentric grooves (which may be circular or spiral), curved grooves, cross hatch grooves (e.g., arranged as an X-Y grid across the pad surface), other regular designs (e.g., hexagons, triangles), tire tread type patterns, irregular designs (e.g., fractal patterns), and combinations thereof. More preferably, the groove design is selected from the group consisting of random grooves, concentric grooves, spiral grooves, cross-hatched grooves, X-Y grid grooves, hexagonal grooves, triangular grooves, fractal grooves and combinations thereof. Most preferably, the polishing surface has a spiral groove pattern formed therein. The groove profile is preferably selected from rectangular with straight side walls or the groove cross section may be "V" shaped, "U" shaped, saw-tooth, and combinations thereof.

In accordance with the methods of making polishing pads in accordance with the present invention, chemical mechanical polishing pads can be molded with a macrotexture or groove pattern in their polishing surface to promote slurry flow and to remove polishing debris from the pad-wafer interface. Such grooves may be formed in the polishing surface of the polishing pad from the shape of the mold surface, i.e. where the mold has a female topographic version of the macrotexture.

The chemical mechanical polishing pad of the present invention can be used for polishing a substrate selected from at least one of a magnetic substrate, an optical substrate and a semiconductor substrate.

Preferably, the method of polishing a substrate of the present invention, comprises: providing a substrate selected from at least one of a magnetic substrate, an optical substrate and a semiconductor substrate (preferably a semiconductor substrate, such as a semiconductor wafer); providing a chemical mechanical polishing pad according to the present invention; creating dynamic contact between a polishing surface of the polishing layer and the substrate to polish a surface of the substrate; and, conditioning of the polishing surface with an abrasive conditioner.

Conditioning the polishing pad comprises bringing a conditioning disk into contact with the polishing surface either during intermittent breaks in the CMP process when polishing is paused ("ex situ"), or while the CMP process is underway ("in situ"). The conditioning disk has a rough conditioning surface typically comprised of imbedded diamond points that cut microscopic furrows into the pad surface, both abrading and plowing the pad material and renewing the polishing texture. Typically the conditioning disk is rotated in a position that is fixed with respect to the axis of rotation of the polishing pad, and sweeps out an annular conditioning region as the polishing pad is rotated.

EXAMPLES

The present invention will now be described in detail in the following, non-limiting Examples:

Unless otherwise stated all temperatures are room temperature (21-23° C.) and all pressures are atmospheric pressure (~760 mm Hg or 101 kPa).

Notwithstanding other raw materials disclosed below, the following raw materials were used in the Examples:

Ethacure™ 300 curative: Dimethylthiotoluenediamine (DMTDA), an aromatic diamine (Albemarle, Charlotte, NC).

Voranol™ V5055HH polyol: Multifunctional polyether polyol (OH Eq. wt 2000), high molecular weight ethylene oxide capped propylene oxide polyol with functionality=6 having a number average molecular weight, MN, of 12,000 (The Dow Chemical Company, Midland, MI (Dow)).

MDI prepolymer: A linear isocyanate-terminated urethane prepolymer from MDI and the small molecules dipropylene glycol (DPG) and tripropylene glycol (TPG), with ~23 wt. % NCO content and equivalent weight of 182. 100 wt. % of this MDI prepolymer is treated as hard segment.

Niax™ L5345 surfactant: A non-ionic organosilicon surfactant (Momentive, Columbus, OH).

DABCO™ 33 LV amine catalyst (Air Products, Allentown, PA) made from diazobicyclononane (triethylene diamine), DABCO 33 LV is a blend of 33 wt. % triethylene diamine and 67 wt. % dipropylene glycol.

PIMEG poly(THF) or polytetramethylene glycol, made via the ring-open polymerization of tetrahydrofuran (THF), and sold as PolyTHF™ polyol (BASF, Leverkusen, DE). The number following PTMEG is the average molecular weight as reported by the manufacturer. This polyol is available commercially from BASF sold as PolyTHF™ and is available in three different grades of molecular weight 650, 1000, or 2000 (PolyTHF 650, Poly THF 1000, PolyTHF2000).

Niax™ T-9 catalyst: stannous octoate (Momentive).

CMP polishing pad properties were evaluated according to the following methods:

All tensile properties were measured in accordance with ASTM D412-06a, "Standard Test Methods for Vulcanized Rubber and Thermoplastic Elastomers—Tension." Samples were cut to dogbone type C dimensions. Unless otherwise indicated, five test specimens were measured and an average of all tested specimens for each analyte sample were reported.

Tensile elongation at break: Means the ratio between changed length after breakage of a test specimen and initial length, and tested in accordance with ASTM D412-06a (2006), "Standard Test Methods for Vulcanized Rubber and Thermoplastic Elastomers—Tension."

In all of the Examples that follow, the indicated two-component reaction mixture was mixed and sprayed onto an open mold using an impingement mixing and air spray system having two tanks (iso tank and poly tank) to feed the mixing system. The two tanks were set at given material flow rates, from which the relative amounts of each of the two components are readily determined. Flow from the two tanks was started and stopped at the same time.

Comparative Example 1: A two-component impingement mixing and air spray system was employed to spray a reaction mixture into an open mold. The iso tank was loaded with MDI prepolymer, while the poly tank was loaded with 98.62 parts PolyTHF650, 0.9857 parts Niax™ L5345 nonionic surfactant, 0.09857 parts Niax™ T-9 catalyst, 0.2957 parts DABCO 33LV catalyst. The flow rates during spraying were 10.11 g/s for the polyol side and 5.89 g/s for the iso side. The air injected into the nozzle was set to a nominal rate of 100 L/min. The sprayed polyurethane formulation was directed onto a polytetrafluoroethylene (PTFE)-coated aluminum plate. The sprayed pad was cured in a 100° C. oven for 16 hours. The resulting polishing layer had a 37 wt. % hard-segment weight fraction at 95% stoichiometry with no added water and produced a single layer pad with a bulk density of 0.88 g/mL and displayed a bulk tensile modulus of 1.37 MPa, tensile strength of 3.10 MPa, 1300% tensile elongation, the 15 second Shore A Hardness was 35.

Comparative Example 2: A two-component impingement mixing and air spray system was employed to spray a reaction mixture into an open mold. The iso tank was loaded with MDI prepolymer, while the poly tank was loaded with 98.62 parts PolyTHF650, 0.9857 parts Niax™ L5345 nonionic surfactant, 0.09857 parts Niax™ T-9 catalyst, 0.2957 parts DABCO 33LV catalyst. The flow rates during spraying were 10.11 g/s for the polyol side and 5.89 g/s for the iso side. The air injected into the nozzle was set to a nominal rate of 20 L/min. The sprayed polyurethane formulation was directed onto a PTFE-coated aluminum plate. The sprayed pad was cured in a 100° C. oven for 16 hours. The resulting pad is described as 37 wt. % hard-segment weight fraction at 95% stoichiometry with no added water and produced a pad with bulk density of 0.97 g/mL and displayed a bulk tensile modulus of 1.65 MPa, tensile strength of 3.65 MPa, and 1200% tensile elongation, the 15 second Shore A Hardness was 36.

Comparative Example 3: A two-component impingement mixing and air spray system was employed to spray a reaction mixture into an open mold. The iso tank was loaded with MDI prepolymer, while the poly tank was loaded with 98.52 parts PolyTHF650, 0.9847 parts Niax™ L5345 nonionic surfactant, 0.09847 parts Niax™ T-9 catalyst, 0.2954 parts DABCO 33LV catalyst and 0.098 parts of water. The flow rates during spraying were 9.99 g/s for the polyol side and 6.01 g/s for the iso side. The air injected into the nozzle was set to a nominal rate of 100 L/min. The sprayed polyurethane formulation was directed onto a Teflon-coated aluminum plate. The sprayed pad was cured in a 100° C. oven for 16 hours. The resulting pad is described as 38 wt. % hard-segment weight fraction at 95% stoichiometry with 1000 ppm water added and produced a pad with bulk density of 0.73 g/mL and displayed a bulk tensile modulus of 1.03 MPa (150 psi), tensile strength of 3.65 MPa (530 psi), and 1200% tensile elongation, the 15 second Shore A Hardness was 32.

Comparative Example 4: A two-component impingement mixing and air spray system was employed to spray a reaction mixture into an open mold. The iso tank was loaded with MDI prepolymer, while the poly tank was loaded with 98.52 parts PolyTHF650, 0.9847 parts Niax™ L5345 nonionic surfactant, 0.09847 parts Niax™ T-9 catalyst, 0.2954 parts DABCO 33LV catalyst and 0.098 parts of water. The flow rates during spraying were 9.99 g/s for the polyol side and 6.01 g/s for the iso side. The air injected into the nozzle was set to a nominal rate of 20 L/min. The sprayed polyurethane formulation was directed onto a Teflon-coated aluminum plate. The sprayed pad was cured in a 100° C. oven for 16 hours. The resulting pad is described as 38 wt. % hard-segment weight fraction at 95% stoichiometry with 1000 ppm water added and produced a pad with bulk density of 0.80 g/mL and displayed a bulk tensile modulus of 1.31 MPa (190 psi), tensile strength of 3.72 MPa (540 psi), and 1200% tensile elongation, the 15 second Shore A Hardness was 33.

Comparative Example 5: A two-component impingement mixing and air spray system was employed to spray a reaction mixture into an open mold. The iso tank was loaded with MDI prepolymer, while the poly tank was loaded with 98.18 parts PolyTHF650, 0.9814 parts Niax L5345 nonionic surfactant, 0.0986 parts Niax T-9 catalyst, 0.2942 parts DABCO 33LV and 0.441 parts of water. The flow rates during spraying were 9.56 g/s for the polyol side and 6.44 g/s for the iso side. The air injected into the nozzle was set to a nominal rate of 100 L/min. The sprayed polyurethane formulation was directed onto a Teflon-coated aluminum plate. The sprayed pad was cured in a 100° C. oven for 16 hours. The resulting pad is described as 40.7 wt. % hard-segment weight fraction at 95% stoichiometry and with 4500 ppm water added produced a pad with bulk density of 0.39 g/mL and displayed a bulk tensile modulus of 0.455 MPa (66 psi), tensile strength of 1.93 MPa (280 psi), and 890% tensile elongation, the 15 second Shore A Hardness was 15.

Comparative Example 6: A two-component impingement mixing and air spray system was employed to spray a reaction mixture into an open mold. The iso tank was loaded with MDI prepolymer, while the poly tank was loaded with 87.99 parts PolyTHF650, 0.88 parts Niax L5345 non-ionic surfactant, 0.0886 parts Niax T-9 catalyst, 0.264 parts DABCO 33LV and 0.220 parts of water and 10.557 parts of dipropylene glycol. The flow rates during spraying were 8.57 g/s for the polyol side and 7.43 g/s for the iso side. The air injected into the nozzle was set to a nominal rate of 100 L/min. The sprayed polyurethane formulation was directed onto a Teflon-coated aluminum plate. The sprayed pad was cured in a 100° C. oven for 16 hours. The resulting pad is described as 52.5 wt. % hard-segment weight fraction at 95% stoichiometry and with 2500 ppm water added produced a pad with bulk density of 0.53 g/mL and displayed a bulk tensile modulus of 1.17 MPa (170 psi), tensile strength of 6.00 MPa (870 psi), and 535% tensile elongation, the 15 second Shore A Hardness was 27.

Example 7: A two-component impingement mixing and air spray system was employed to spray a reaction mixture into an open mold. The iso tank was loaded with MDI prepolymer, while the poly tank was loaded with 73.179 parts PolyTHF650, 0.7316 parts Niax L5345 non-ionic surfactant, 0.0734 parts Niax T-9 catalyst, 0.2189 parts DABCO 33LV and 0.183 parts of water and 25.6126 parts of dipropylene glycol. The flow rates during spraying were 7.26 g/s for the polyol side and 8.74 g/s for the iso side. The air injected into the nozzle was set to a nominal rate of 100 L/min. The sprayed polyurethane formulation was directed onto a Teflon-coated aluminum plate. The sprayed pad was cured in a 100° C. oven for 16 hours. The resulting one layer pad is described as 66 wt. % hard-segment weight fraction at 95% stoichiometry and with 2500 ppm water added produced a pad with bulk density of 0.49 g/mL and displayed a bulk tensile modulus of 207 MPa (30,100 psi), tensile strength of 7.58 MPa (1,100 psi), and 66% tensile elongation, the 15 second Shore A hardness was 82, and Shore DO (15 sec) hardness was 60.

Polishing experiments were performed on 200 mm wafers on an Applied Mirra polisher (Applied Materials, Santa Clara, CA) with a carrier downforce of 0.014, 0.016, 0.021, and 0.026 MPa (2.0, 2.3, 3.0, and 3.8 psi), a slurry flow rate of 200 mL/min and a Klebosol™ 111730 colloidal silica slurry (Dow, 16 wt. % solids), a table rotation speed of 93 rpm and a carrier rotation speed of 87 rpm. A 3M™ Diamond Pad Conditioner A153L, 108 mm (4.25 inch) diameter with aggressiveness rating from 3M of 6-9 (The 3M Company, Minneapolis, MN) was used to condition and texture the polishing pads. The polishing pads were each broken in with the conditioner and DI water only using a down force of 22.2 N for 30 min. The polishing pads were further conditioned 100% in situ during polishing at 10 sweeps/min from 43 to 234 mm (1.7 to 9.2 in) from the center of the polishing pad with a down force of 22.2 N. The wafers were cleaned on a Lam OnTrack DSS-200 Synergy™ post CMP cleaner (Lam Research, Fremont, CA). To further highlight shallow scratches a hydrogen fluoride (HF) etch was performed on an SSEC single wafer etch system (Veeco, Horsham, PA) whereby 200 Ang of TEOS was etched from the wafer. Step heights for planarization measurements were performed on a Bruker Dynamic Atomic Force Profiler, (Bruker, Billerica, MA). The substrate was a tetraethoxysilicate (TEOS) wafer substrate. The removal rates were determined by measuring the film thickness before and after polishing using a KLA-Tencor FX200™ metrology tool (KLA Tencor, Milpitas, CA) using a 49 point spiral scan with a 3 mm edge exclusion. Removal rate was calculated by the change in thickness in the individual points for the designated polishing time, in Angstroms/min.

Non-Uniformity Ratio (% NUR) was calculated by % standard deviation of the removal rates.

Defectivity was determined using a SP2 XP™ and eDR5210™ scanning electron microscope wafer defect review system (KLA-Tencor). Categorization of defect type was performed manually from a randomly selected set of 100 defects using Klarity Defect™ software.

Defects were categorized, as follows:
A—Anything the computer sees before HF etching; and,
B—Anything the computer sees after HF etching; and
C—Chattermark scratches as identified by visual inspection by trained personnel.

Polishing results are given in Table 1, below.

TABLE 1

| | Pad Performance | | |
|---|---|---|---|
| | Removal Rate (Ang/min) | % Non-uniformity (NUR) | Defect Count Post Polish no HF |
| Example 7 | 2810 | 6.5% | 302 |
| Comparative IC1000 | 2620 | 6.5% | 405 |

The removal rate profile is given in Table 1, above, shows a 7% higher removal rate compared to IC1000™ pads. Wafers were imaged directly after polishing following a DI water rinse and dry. The average number of defects post polish for the IC1000™ pad was 405, while Example 7 produced on average 302 defects. Thus, the inventive pad of Example 7 demonstrates slightly improved removal rate and greater pad hardness but with substantially reduced defects in polishing. It is expected that more porous pads of lower densities, below 0.49 g/mL, would not be as hard and would provide even better defectivity performance.

We claim:

1. A chemical mechanical (CMP) polishing pad for polishing a substrate chosen from at least one of a magnetic substrate, an optical substrate and a semiconductor substrate, the polishing pad comprising a polishing layer adapted for polishing the substrate, the polishing layer being a polyurethane, the polyurethane is a product of an organic solvent free two-component reaction mixture comprising (i) a liquid aromatic isocyanate component comprising one or more aromatic diisocyanates or a linear aromatic isocyanate-terminated urethane prepolymer having an unreacted isocyanate (NCO) concentration of from 18 to 40 wt. %, based on the total solids weight of the aromatic isocyanate component, and (ii) a liquid polyol component comprising a) one or more polymeric polyols, b) from 15 to 36 wt. %, based on the total weight of the liquid polyol component, of one or more small chain difunctional polyols having from 2 to 6 carbon atoms, c) from 0 to 25 wt. %, based on the total weight of the liquid polyol component, of a liquid aromatic diamine which is a liquid at standard pressure and at 40° C., and d) an amount of water or $CO_2$-amine adduct sufficient to reduce the density of a CMP polishing pad made from the two-component reaction mixture to from 0.2 to 0.50 g/mL, wherein the reaction mixture comprises 60 to 75 wt. % of hard segment materials, based on the total weight of the reaction mixture, wherein the CMP polishing layer has a Shore DO (15 second) hardness of from 40 to 80, and with densities of from 0.2 to 0.50 g/mL.

2. The CMP polishing pad as claimed in claim 1, wherein the (i) liquid aromatic isocyanate component comprises one or more diisocyanate or isocyanate-terminated linear urethane prepolymer compound chosen from methylene diphenyl diisocyanate (MDI), toluene diisocyanate (TDI), napthalene diisocyanate (NDI), paraphenylene diisocyanate (PPDI), or o-toluidine diisocyanate (TODI); a linear isocyanate-terminated urethane prepolymer of any of MDI, TDI, NDI, PPDA, TODI or mixtures thereof extended with one or more extender compound; or mixtures thereof.

3. The CMP polishing pad as claimed in claim 2, wherein the (i) liquid aromatic isocyanate component is chosen from the group consisting of methylene diphenyl diisocyanate (MDI) or a linear isocyanate-terminated urethane prepolymer of MDI which is MDI or an MDI dimer extended with any of ethylene glycol, 1,2-propylene glycol, 1,3-propylene glycol, 1,2-butanediol, 1,3-butanediol, 2-methyl-1,3-propanediol, 1,4-butanediol, neopentyl glycol, 1,5-pentanediol, 3-methyl-1,5-pentanediol, 1,6-hexanediol, diethylene glycol, dipropylene glycol, tripropylene glycol, and mixtures thereof.

4. The CMP polishing pad as claimed in claim 1, wherein in the (ii) liquid polyol component, the one or more polymeric polyols is chosen from the group consisting of polytetramethylene glycol (PTMEG), polypropylene glycol (PPG), a hexafunctional polyol, and mixtures thereof.

5. The CMP polishing pad as claimed in claim 1, wherein in the (ii) liquid polyol component, the one or more small chain difunctional polyols having from 2 to 6 carbon atoms is chosen from the group consisting of ethylene glycol, 1,2-propylene glycol, 1,3-propylene glycol, 1,2-butanediol, 1,3-butanediol, 2-methyl-1,3-propanediol, 1,4-butanediol, neopentyl glycol, 1,5-pentanediol, 3-methyl-1,5-pentanediol, 1,6-hexanediol, diethylene glycol, dipropylene glycol, triethylene glycol, and mixtures thereof.

6. The CMP polishing pad as claimed in claim 5, wherein in the (ii) liquid polyol component, the one or more small chain difunctional polyols having from 2 to 6 carbon atoms is chosen from the group consisting of ethylene glycol, 1,2-propylene glycol, 1,3-propylene glycol, diethylene glycol, dipropylene glycol, and mixtures thereof.

7. The CMP polishing pad as claimed in claim 1, wherein the reaction mixture comprises from greater than 63 to 75 wt. % of hard segment materials.

8. The CMP polishing pad as claimed in claim 1, wherein the stoichiometric ratio of the sum of the total moles of amine ($NH_2$) groups and the total moles of hydroxyl (OH) groups in the reaction mixture to the total moles of unreacted isocyanate (NCO) groups in the reaction mixture to make the CMP polishing layer ranges from 0.85:1.0 to 1.15:1.0.

9. The CMP polishing pad as claimed in claim 1, wherein the CMP polishing pad contains no microelements other than those formed by the water or $CO_2$-amine adduct.

10. The CMP polishing pad as claimed in claim 1, wherein d) is water in the amount of from 1,000 and 8,500 ppm, based on the total weight of the two-component reaction mixture.

* * * * *